(12) United States Patent
Suh et al.

(10) Patent No.: US 10,692,993 B2
(45) Date of Patent: Jun. 23, 2020

(54) SEMICONDUCTOR DEVICE AND METHOD FOR MANUFACTURING THE SAME

(71) Applicant: SAMSUNG ELECTRONICS CO., LTD., Suwon-si, Gyeonggi-do (KR)

(72) Inventors: Dong Chan Suh, Suwon-si (KR); Sangmoon Lee, Suwon-si (KR); Yihwan Kim, Seongnam-si (KR); Woo Bin Song, Hwaseong-si (KR); Dongsuk Shin, Yongin-si (KR); Seung Ryul Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/956,166

(22) Filed: Apr. 18, 2018

(65) Prior Publication Data

US 2019/0081160 A1    Mar. 14, 2019

(30) Foreign Application Priority Data

Sep. 13, 2017  (KR) ........................ 10-2017-0117398

(51) Int. Cl.

| | |
|---|---|
| H01L 21/82 | (2006.01) |
| H01L 29/66 | (2006.01) |
| H01L 21/28 | (2006.01) |
| H01L 29/786 | (2006.01) |
| H01L 29/423 | (2006.01) |
| H01L 29/78 | (2006.01) |

(52) U.S. Cl.
CPC .. *H01L 29/66818* (2013.01); *H01L 21/28132* (2013.01); *H01L 29/42392* (2013.01); *H01L 29/66439* (2013.01); *H01L 29/66545* (2013.01); *H01L 29/78696* (2013.01); *H01L 29/7848* (2013.01)

(58) Field of Classification Search
CPC combination set(s) only.
See application file for complete search history.

(56) References Cited

U.S. PATENT DOCUMENTS

| 7,374,986 B2 | 5/2008 | Kim et al. |
| 9,431,512 B2 | 8/2016 | Koh et al. |
| (Continued) | | |

FOREIGN PATENT DOCUMENTS

| CN | 103426764 A | 12/2013 |
| KR | 10-2017-0090092 A | 8/2017 |

*Primary Examiner* — Moin M Rahman
(74) *Attorney, Agent, or Firm* — Lee IP Law, P.C.

(57) ABSTRACT

A method for manufacturing a semiconductor device and a semiconductor device, the method including forming an active pattern on a substrate such that the active pattern includes sacrificial patterns and semiconductor patterns alternately and repeatedly stacked on the substrate; and forming first spacer patterns at both sides of each of the sacrificial patterns by performing an oxidation process, wherein the first spacer patterns correspond to oxidized portions of each of the sacrificial patterns, wherein the sacrificial patterns include a first semiconductor material containing impurities, wherein the semiconductor patterns include a second semiconductor material different from the first semiconductor material, and wherein the impurities include an element different from semiconductor elements of the first semiconductor material and the second semiconductor material.

19 Claims, 15 Drawing Sheets

(56) References Cited

U.S. PATENT DOCUMENTS

| | | |
|---|---|---|
| 9,484,406 B1 | 11/2016 | Sun et al. |
| 9,484,447 B2 | 11/2016 | Kim et al. |
| 9,647,098 B2 | 5/2017 | Obradovic et al. |
| 2007/0196973 A1* | 8/2007 | Park ................. H01L 21/82341 |
| | | 438/197 |
| 2010/0207208 A1 | 8/2010 | Bedell et al. |
| 2012/0119327 A1* | 5/2012 | Kwon ............... H01L 27/10852 |
| | | 257/532 |
| 2015/0129830 A1 | 5/2015 | Sung et al. |
| 2015/0303303 A1 | 10/2015 | Lauer et al. |
| 2016/0020305 A1* | 1/2016 | Obradovic .......... H01L 29/7391 |
| | | 257/39 |
| 2016/0027870 A1 | 1/2016 | Cheng et al. |
| 2017/0005180 A1 | 1/2017 | Cheng et al. |
| 2017/0222006 A1 | 8/2017 | Suh et al. |
| 2017/0256611 A1 | 9/2017 | Kim et al. |
| 2017/0345945 A1 | 11/2017 | Lee et al. |
| 2018/0219083 A1* | 8/2018 | Guillorn ........... H01L 29/66553 |

* cited by examiner

SEMICONDUCTOR DEVICE AND METHOD FOR MANUFACTURING THE SAME

CROSS-REFERENCE TO RELATED APPLICATION

Korean Patent Application No. 10-2017-0117398, filed on Sep. 13, 2017, in the Korean Intellectual Property Office, and entitled: "Semiconductor Device and Method for Manufacturing the Same," is incorporated by reference herein in its entirety.

BACKGROUND

1. Field

Embodiments relate to a semiconductor device a method for manufacturing the same.

2. Description of the Related Art

A semiconductor device may include an integrated circuit including metal-oxide-semiconductor field effect transistors (MOSFETs). As sizes and design rules of semiconductor devices have been reduced, MOSFETs have been scaled down.

SUMMARY

The embodiments may be realized by providing a method for manufacturing a semiconductor device, the method including forming an active pattern on a substrate such that the active pattern includes sacrificial patterns and semiconductor patterns alternately and repeatedly stacked on the substrate; and forming first spacer patterns at both sides of each of the sacrificial patterns by performing an oxidation process, wherein the first spacer patterns correspond to oxidized portions of each of the sacrificial patterns, wherein the sacrificial patterns include a first semiconductor material containing impurities, wherein the semiconductor patterns include a second semiconductor material different from the first semiconductor material, and wherein the impurities include an element different from semiconductor elements of the first semiconductor material and the second semiconductor material.

The embodiments may be realized by providing a method for manufacturing a semiconductor device, the method including forming a preliminary active pattern extending in a first direction on a substrate such that the preliminary active pattern includes preliminary sacrificial patterns and preliminary semiconductor patterns alternately and repeatedly stacked on the substrate; forming a sacrificial gate pattern on the substrate such that the sacrificial gate pattern extends in a second direction intersecting the first direction to intersect the preliminary active pattern; removing portions of the preliminary active pattern at both sides of the sacrificial gate pattern to form an active pattern under the sacrificial gate pattern such that the active pattern includes sacrificial patterns and semiconductor patterns alternately and repeatedly stacked; and oxidizing both sidewalls of the active pattern to form first spacer patterns at both sides of each of the sacrificial patterns and second spacer patterns at both sides of each of the semiconductor patterns at the same time, wherein the preliminary sacrificial patterns and the sacrificial patterns include a first semiconductor material containing impurities, wherein the preliminary semiconductor patterns and the semiconductor patterns include a second semiconductor material different from the first semiconductor material, and wherein the impurities include an element different from semiconductor elements of the first and second semiconductor materials.

The embodiments may be realized by providing a semiconductor device including a channel pattern on a substrate, the channel pattern including a plurality of semiconductor patterns spaced apart from each other in a direction perpendicular to a top surface of the substrate; source/drain patterns spaced apart from each other on the substrate with the channel pattern interposed therebetween; a gate electrode covering a topmost surface of the channel pattern and interleaved between the semiconductor patterns; and spacer patterns provided under each of the plurality of semiconductor patterns and spaced apart from each other with the gate electrode interposed therebetween, wherein each of the spacer patterns is disposed between each of the source/drain patterns and the gate electrode, wherein the spacer patterns include an oxide containing impurities, and wherein the impurities include aluminum (Al), gallium (Ga), antimony (Sb), arsenic (As), indium (In), zirconium (Zr), hafnium (Hf), or tantalum (Ta).

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, embodiments will be described in detail with reference to the accompanying drawings.

Figure 1:
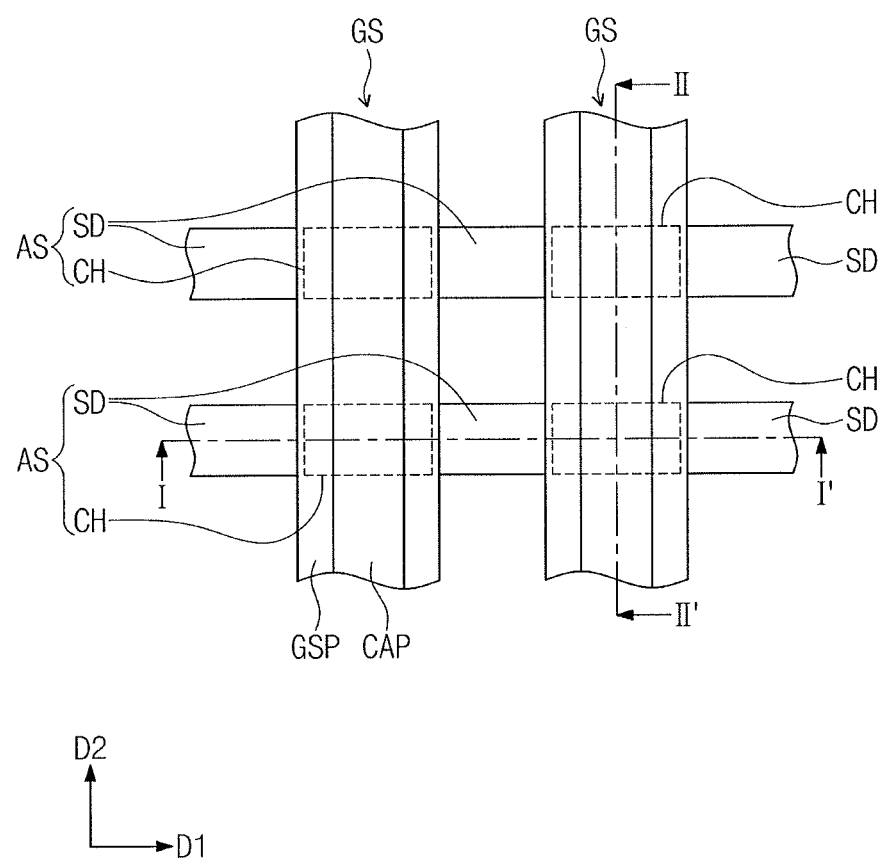
FIG. 1 illustrates a plan view of a semiconductor device according to some embodiments.
Figure 2:
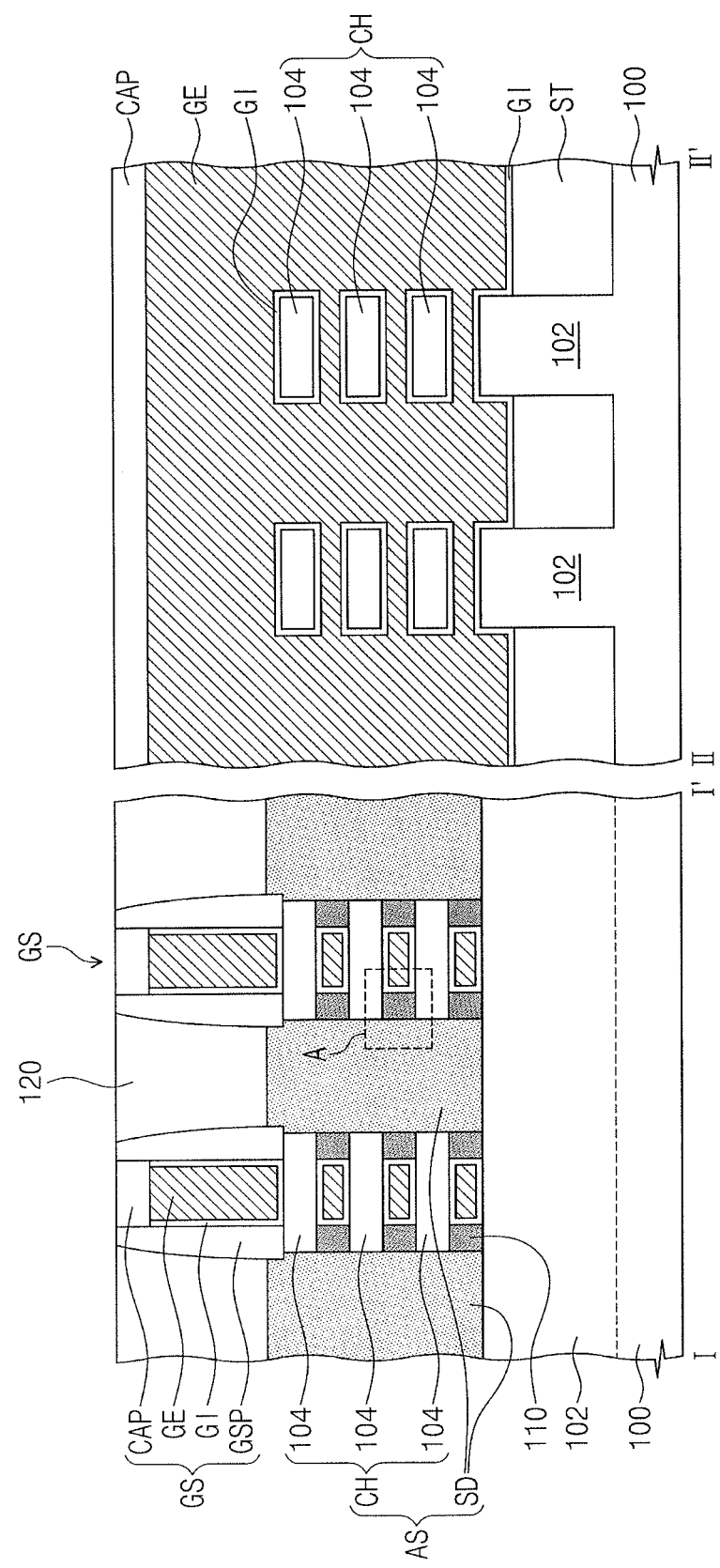
FIG. 2 illustrates a cross-sectional view taken along lines I-I' and II-II' of FIG. 1.
Figure 3A:
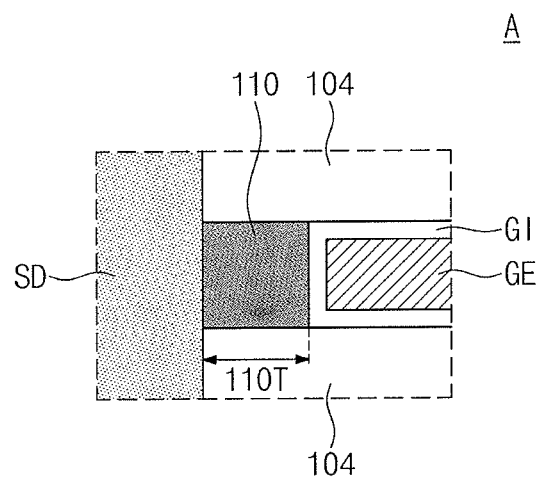
FIGS. 3A and 3B illustrate enlarged views of a portion 'A' of FIG. 2.
Figure 3B:
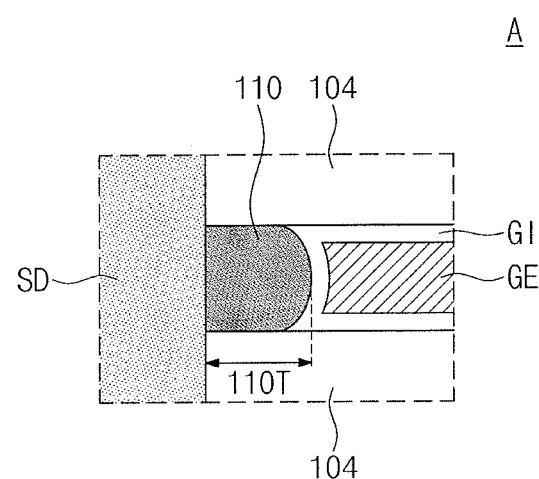

FIG. 1 illustrates a plan view of a semiconductor device according to some embodiments, and FIG. 2 illustrates a cross-sectional view taken along lines I-I' and II-II' of FIG. 1. FIGS. 3A and 3B illustrate enlarged views of a portion 'A' of FIG. 2.

Referring to FIGS. 1 and 2, a base active pattern 102 may be provided on a substrate 100. The substrate 100 may be a semiconductor substrate. For example, the substrate 100 may be a silicon substrate or a silicon-on-insulator (SOI) substrate. The base active pattern 102 may protrude from the substrate 100 in a direction perpendicular to a top surface of the substrate 100 and may extend (e.g., lengthwise) in a first direction D1 parallel to the top surface of the substrate 100. In an implementation, the base active pattern 102 may be provided in plurality. The plurality of base active patterns 102 may be arranged (e.g., spaced apart) in a second direction D2 that intersects the first direction D1 and is parallel to the top surface of the substrate 100.

Device isolation patterns ST may be provided on the substrate 100 at both sides of the base active pattern 102. The device isolation patterns ST may extend in the first direction D1 and may be spaced apart from each other in the second direction D2 with the base active pattern 102 interposed therebetween. The device isolation patterns ST may include, e.g., an oxide, a nitride, or an oxynitride. In an implementation, the device isolation patterns ST may expose sidewalls of an upper portion of the base active pattern 102. Top surfaces of the device isolation patterns ST may be disposed at a lower level than a top surface of the base active pattern 102. The term "level" may mean a height from the substrate 100.

An active structure AS may be provided on the base active pattern 102. The active structure AS may overlap with the base active pattern 102 when viewed in a plan view. The active structure AS may extend along the top surface of the base active pattern 102 in the first direction D1. The active structure AS may include a channel pattern CH, and source/drain patterns SD spaced apart from each other in the first direction D1 with the channel pattern CH interposed therebetween. The channel pattern CH and the source/drain patterns SD may be arranged along the top surface of the base active pattern 102 in the first direction D1. A plurality of the active structures AS may be provided on the plurality of base active patterns 102, respectively. The plurality of active structures AS may be spaced apart from each other in the second direction D2.

The channel pattern CH may include a plurality of semiconductor patterns 104 stacked in the direction perpendicular to the top surface of the substrate 100. The semiconductor patterns 104 may be spaced apart from each other in the direction perpendicular to the top surface of the substrate 100. A lowermost one of the semiconductor patterns 104 may be spaced apart from the base active pattern 102 in the direction perpendicular to the top surface of the substrate 100. The semiconductor patterns 104 may be disposed between the source/drain patterns SD and may be in contact with the source/drain patterns SD. Each of the source/drain patterns SD may be in contact with sidewalls of the semiconductor patterns 104. Each of the semiconductor patterns 104 may connect the source/drain patterns SD to each other. In an implementation, as illustrated in FIG. 2, the number of the semiconductor patterns 104 may be, e.g., three. In an implementation, the semiconductor patterns 104 may be included in a different number. In an implementation, the semiconductor patterns 104 may include, e.g., silicon (Si), silicon-germanium (SiGe), or germanium (Ge).

The source/drain patterns SD may include epitaxial patterns formed using the semiconductor patterns 104 and the base active pattern 102 as a seed. In an implementation, the source/drain patterns SD may include, e.g., silicon-germanium (SiGe), silicon (Si) or silicon carbide (SiC). In an implementation, the source/drain patterns SD may be configured to provide tensile strain to the channel pattern CH. For example, when the semiconductor patterns 104 include silicon (Si), the source/drain patterns SD may include silicon (Si) and/or silicon carbide (SiC). In an implementation, the source/drain patterns SD may be configured to provide compressive strain to the channel pattern CH. For example, when the semiconductor patterns 104 include silicon (Si), the source/drain patterns SD may include silicon-germanium (SiGe). The source/drain patterns SD may further include dopants. The dopants may be employed to help improve electrical characteristics of a transistor including the source/drain patterns SD. When the transistor is an N-channel metal-oxide-semiconductor field effect transistor (NMOSFET), the dopants may include, e.g., phosphorus (P). When the transistor is a P-channel metal-oxide-semiconductor field effect transistor (PMOSFET), the dopants may include, e.g., boron (B).

A gate structure GS may be provided on the active structure AS and may intersect the active structure AS. The gate structure GS may extend in the second direction D2 to intersect the base active pattern 102 and the device isolation patterns ST. The channel pattern CH may overlap with the gate structure GS in a plan view, and the source/drain patterns SD may be provided at both sides of the gate structure GS in a plan view. The gate structure GS may extend in the second direction D2 to intersect the plurality of active structures AS.

The gate structure GS may include a gate electrode GE, a gate insulating pattern GI between the gate electrode GE and the channel pattern CH, gate spacers GSP on sidewalls of the gate electrode GE, and a gate capping pattern CAP on a top surface of the gate electrode GE. The gate insulating pattern GI may extend between the gate electrode GE and the gate spacers GSP, and a topmost surface of the gate insulating pattern GI may be substantially coplanar with the top surface of the gate electrode GE. The gate electrode GE may cover a topmost surface of the channel pattern CH and may also cover sidewalls, opposite to each other in the second direction D2, of the channel pattern CH. The gate electrode GE may extend in the second direction D2 to cover the top surfaces of the device isolation patterns ST. The gate electrode GE may fill spaces between the channel pattern CH and the base active pattern 102 and between the semiconductor patterns 104. The gate insulating pattern GI may be disposed between the gate electrode GE and each of the semiconductor patterns 104 and may surround an outer surface of each of the semiconductor patterns 104. Each of the semiconductor patterns 104 may be spaced apart from the gate electrode GE with the gate insulating pattern GI interposed therebetween. The gate insulating pattern GI may extend along a bottom surface of the gate electrode GE and may be disposed between the gate electrode GE and the base active pattern 102 and between the gate electrode GE and each of the device isolation patterns ST. The gate electrode GE, the channel pattern CH, and the source/drain patterns SD may constitute a gate-all-around type field effect transistor.

The gate electrode GE may include, e.g., a doped semiconductor material, a conductive metal nitride, or a metal. The gate insulating pattern GI may include, e.g., a silicon oxide layer, a silicon nitride layer, a silicon oxynitride layer, or a high-k dielectric layer. The high-k dielectric layer may include a material of which a dielectric constant is higher than that of a silicon oxide layer. In an implementation, the high-k dielectric layer may include, e.g., a hafnium oxide (HfO) layer, an aluminum oxide (AlO) layer, or a tantalum oxide (TaO) layer. Each of the gate capping pattern CAP and the gate spacers GSP may include, e.g., a silicon oxide layer, a silicon nitride layer, or a silicon oxynitride layer.

Spacer patterns 110 may be provided between each of the source/drain patterns SD and the gate electrode GE. The spacer patterns 110 may be provided at each side of the gate electrode GE and may be spaced apart from each other in the direction perpendicular to the top surface of the substrate 100 (as well as in the first direction). The spacer patterns 110 and the semiconductor patterns 104 may be alternately and repeatedly stacked in the direction perpendicular to the top surface of the substrate 100. Each of the spacer patterns 110 may be provided between the semiconductor patterns 104 vertically adjacent to each other or between the lowermost semiconductor pattern 104 and the base active pattern 102. Each of the source/drain patterns SD may be in contact with the semiconductor patterns 104 and may be spaced apart from the gate electrode GE with the spacer patterns 110 interposed therebetween. The gate insulating pattern GI may be disposed between the gate electrode GE and each of the semiconductor patterns 104 and may extend between the gate electrode GE and each of the spacer patterns 110. Each of the spacer patterns 110 may be in contact with the gate insulating pattern GI.

Referring to FIGS. 3A and 3B, each of the spacer patterns 110 may have a thickness 110T in the first direction D1. In an implementation, the thickness 110T of each of the spacer patterns 110 may range from, e.g., about 1 Å to about 10 nm. In an implementation, each of the spacer patterns 110 may have a substantially quadrilateral shape (e.g., a rectangular or square shape), as illustrated in FIG. 3A. In this case, one surface of each of the spacer patterns 110, which is adjacent to the gate electrode GE, may be substantially flat. In an implementation, a part of each of the spacer patterns 110 may have a substantially semicircular shape, as illustrated in FIG. 3B. For example, one surface of each of the spacer patterns 110, which is adjacent to the gate electrode GE, may be rounded toward the gate electrode GE.

In an implementation, the spacer patterns 110 may include an oxide containing impurities. In an implementation, the impurities may include, e.g., aluminum (Al), gallium (Ga), antimony (Sb), arsenic (As), indium (In), germanium (Ge), zirconium (Zr), hafnium (Hf), or tantalum (Ta). In an implementation, the spacer patterns 110 may include silicon nitride. In an implementation, the spacer patterns 110 may include, e.g., SiN, SiCN, SiOCN, SiBCN, or SiBN.

Referring again to FIGS. 1 and 2, an interlayer insulating layer 120 may be provided on the substrate 100 and may cover the gate structure GS and the source/drain patterns SD. In an implementation, the interlayer insulating layer 120 may include, e.g., a silicon oxide layer, a silicon nitride layer, a silicon oxynitride layer, or a low-k dielectric layer. A top surface of the gate capping pattern CAP may be substantially coplanar with a top surface of the interlayer insulating layer 120. The gate spacer GSP may be disposed between the gate capping pattern CAP and the interlayer insulating layer 120.

In an implementation, an upper insulating layer may be provided on the interlayer insulating layer 120. The upper insulating layer may include, e.g., an oxide layer, a nitride layer, or an oxynitride layer. First contact plugs may penetrate the upper insulating layer and the interlayer insulating layer 120 so as to be electrically connected to the source/drain patterns SD, and a second contact plug may penetrate the upper insulating layer and the gate capping pattern CAP so as to be electrically connected to the gate electrode GE. Interconnection lines may be disposed on the upper insulating layer and may be connected to the first and second contact plugs. The interconnection lines may be electrically connected to the source/drain patterns SD and the gate electrode GE through the first and second contact plugs. Voltages may be applied to the source/drain patterns SD and the gate electrode GE through the interconnection lines and the first and second contact plugs. The first and second contact plugs and the interconnection lines may include a conductive material.

FIGS. 4 to 11 illustrate cross-sectional views corresponding to the lines I-I' and II-II' of FIG. 1 to show stages in a method for manufacturing a semiconductor device according to some embodiments. FIGS. 12A and 12B illustrate enlarged views of a portion 'B' of FIG. 7.

Figure 4:
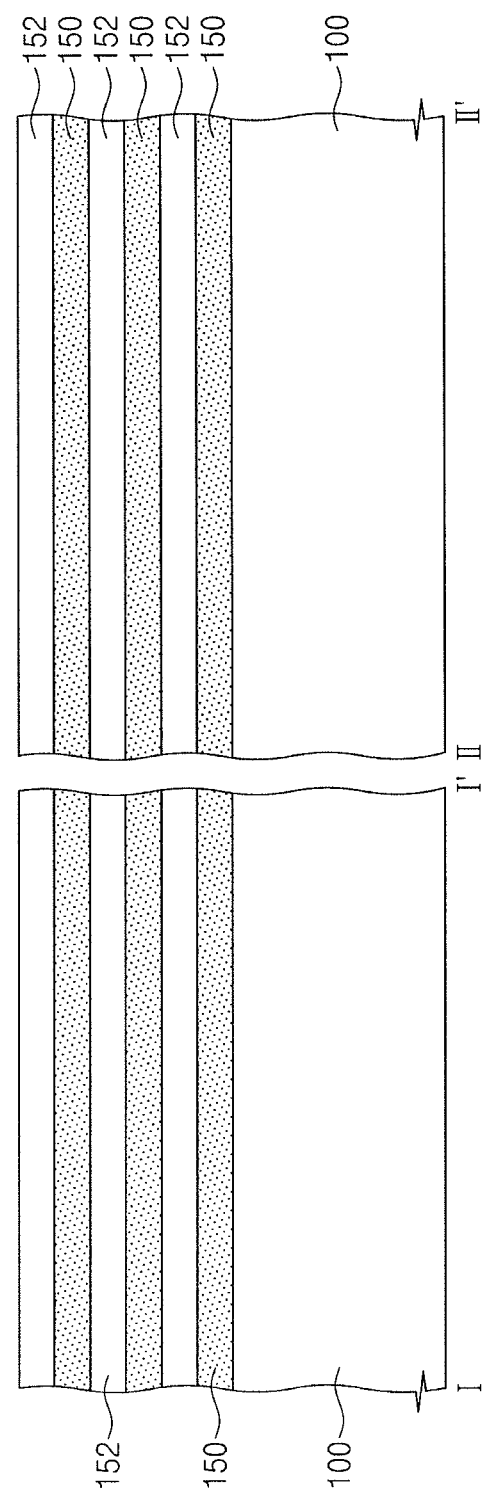
FIGS. 4 to 11 illustrate cross-sectional views corresponding to the lines I-I' and II-II' of FIG. 1 to show stages in a method for manufacturing a semiconductor device according to some embodiments.

Referring to FIGS. 1 and 4, sacrificial layers 150 and semiconductor layers 152 may be alternately and repeatedly stacked on a substrate 100. In an implementation, the sacrificial layers 150 and the semiconductor layers 152 may be repeatedly stacked three times, as illustrated in FIG. 4. In an implementation, the sacrificial layers 150 and the semiconductor layers 152 may be repeatedly stacked a suitable number of times. The sacrificial layers 150 and the semiconductor layers 152 may have thicknesses in a direction perpendicular to a top surface of the substrate 100. In an implementation, the thickness of each of the sacrificial layers 150 may range from, e.g., about 1 Å to about 100 nm, and the thickness of each of the semiconductor layers 152 may range from, e.g., about 1 Å to about 100 nm. The sacrificial layers 150 may include a material having an etch selectivity with respect to the semiconductor layers 152.

The sacrificial layers 150 may include a first semiconductor material containing impurities. The impurities may include an element different from a semiconductor element of the first semiconductor material. In an implementation, the first semiconductor material may include, e.g., silicon (Si), silicon-germanium (SiGe), or germanium (Ge). In an implementation, the impurities may include, e.g., aluminum (Al), gallium (Ga), antimony (Sb), arsenic (As), indium (In), germanium (Ge), zirconium (Zr), hafnium (Hf), or tantalum (Ta). For example, each of the sacrificial layers 150 may be a silicon-germanium (SiGe) layer doped with aluminum (Al). The semiconductor layers 152 may include a second semiconductor material different from the first semiconductor material. In an implementation, the second semiconductor material may include, e.g., silicon (Si), silicon-germanium (SiGe), or germanium (Ge) and may be different from the first semiconductor material. For example, each of the semiconductor layers 152 may be a silicon (Si) layer. The impurities may include an element different from semiconductor elements of the first and second semiconductor materials.

The sacrificial layers 150 and the semiconductor layers 152 may be formed by performing an epitaxial growth process using the substrate 100 as a seed. The thicknesses of the sacrificial layers 150 may be equal to or different from the thicknesses of the semiconductor layers 152.

Figure 5:
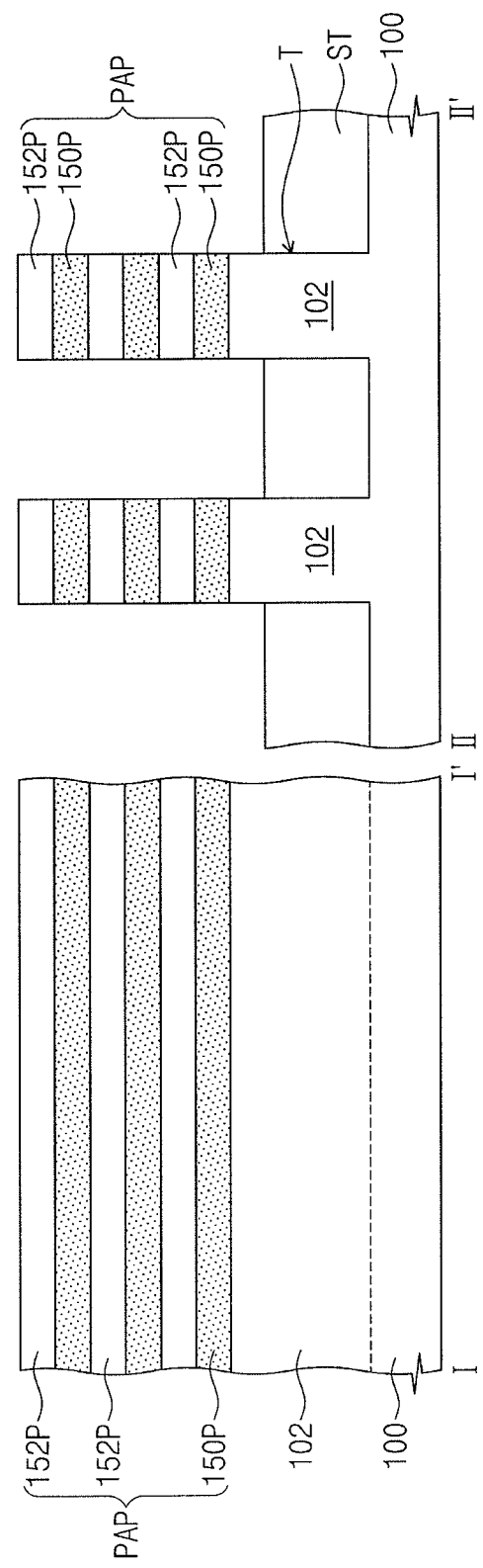

Referring to FIGS. 1 and 5, a preliminary active pattern PAP and a base active pattern 102 may be formed on the substrate 100. For example, the semiconductor layers 152, the sacrificial layers 150, and an upper portion of the substrate 100 may be sequentially patterned to form trenches T defining the preliminary active pattern PAP and the base active pattern 102. The trenches T may have linear shapes extending in the first direction D1 and may be spaced apart from each other in the second direction D2. The preliminary active pattern PAP may include preliminary sacrificial patterns 150P and preliminary semiconductor patterns 152P, which are formed by patterning the sacrificial layers 150 and the semiconductor layers 152, respectively. The preliminary active pattern PAP may have a linear shape extending in the first direction D1. The preliminary sacrificial patterns 150P and the preliminary semiconductor patterns 152P may be alternately and repeatedly stacked in the direction perpendicular to the top surface of the substrate 100. The preliminary sacrificial patterns 150P and the preliminary semiconductor patterns 152P may have linear shapes extending in the first direction D1. The base active pattern 102 may be formed by patterning the upper portion of the substrate 100. The base active pattern 102 may have a linear shape extending in the first direction D1, and the preliminary active pattern PAP may be formed on a top surface of the base active pattern 102.

Device isolation patterns ST may be formed to fill the trenches T, respectively. The device isolation patterns ST may be formed on the substrate 100 (e.g., in the trenches T) at both sides of the base active pattern 102. The device isolation patterns ST may extend in the first direction D1 and may be spaced apart from each other in the second direction D2 with the base active pattern 102 interposed therebetween. The formation of the device isolation patterns ST may include forming an insulating layer filling the trenches T on the substrate 100, and recessing the insulating layer to completely expose sidewalls of the preliminary active pattern PAP. Top surfaces of the device isolation patterns ST may be disposed at a lower level than the top surface of the base active pattern 102. In an implementation, the device isolation patterns ST may include, e.g., an oxide, a nitride, or an oxynitride.

Figure 6:
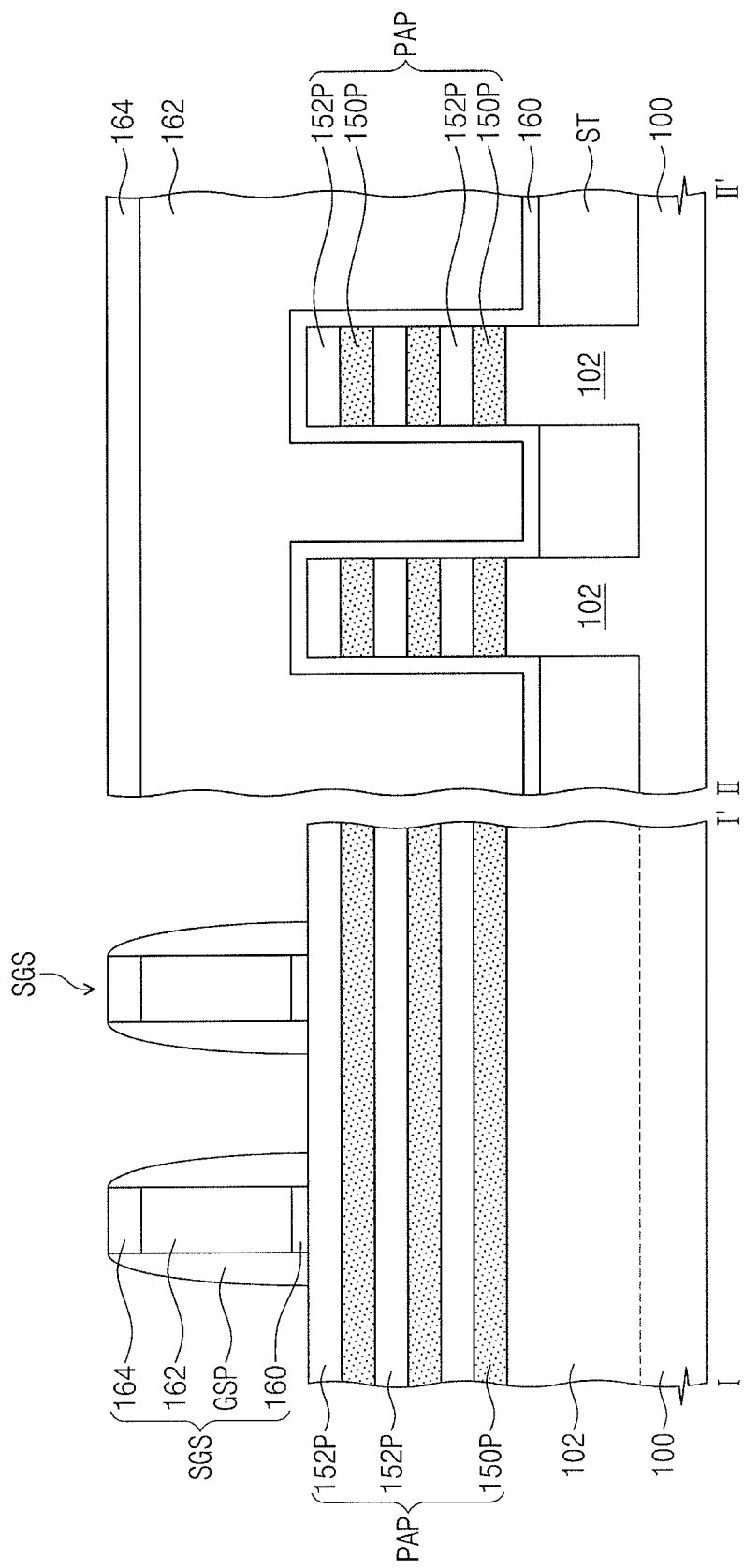

Referring to FIGS. 1 and 6, a sacrificial gate structure SGS may be formed to intersect the preliminary active pattern PAP. The sacrificial gate structure SGS may extend in the second direction D2 to intersect the base active pattern 102 and the device isolation patterns ST. The sacrificial gate structure SGS may include an etch stop pattern 160, a sacrificial gate pattern 162, and a mask pattern 164, which are sequentially stacked on the substrate 100. The sacrificial gate pattern 162 may have a linear shape extending in the second direction D2. The sacrificial gate pattern 162 may cover sidewalls, opposite to each other in the second direction D2, of the preliminary active pattern PAP and may cover a top surface of the preliminary active pattern PAP and the top surfaces of the device isolation patterns ST. The etch stop pattern 160 may be disposed between the sacrificial gate pattern 162 and the preliminary active pattern PAP and may extend between the sacrificial gate pattern 162 and each of the device isolation patterns ST. In an implementation, for forming the sacrificial gate pattern 162 and the etch stop pattern 160, an etch stop layer and a sacrificial gate layer may be sequentially formed on the substrate 100 to cover the preliminary active pattern PAP and the device isolation patterns ST, and the mask pattern 164 defining a region where the sacrificial gate pattern 162 will be formed may be formed on the sacrificial gate layer. The sacrificial gate layer and the etch stop layer may be sequentially patterned using the mask pattern 164 as an etch mask to form the etch stop pattern 160 and the sacrificial gate pattern 162. For example, the etch stop layer may include a silicon oxide layer. The sacrificial gate layer may include a material having an etch selectivity with respect to the etch stop layer. For example, the sacrificial gate layer may include a poly-silicon layer. The sacrificial gate layer may be patterned using the mask pattern 164 as the etch mask to form the sacrificial gate pattern 162. The patterning of the sacrificial gate layer may include performing an etching process having an etch selectivity with respect to the etch stop layer. The etch stop layer at both sides of the sacrificial gate pattern 162 may be removed after the formation of the sacrificial gate pattern 162, and thus the etch stop pattern 160 may be formed locally under the sacrificial gate pattern 162.

The sacrificial gate structure SGS may further include gate spacers GSP formed on both sidewalls of the sacrificial gate pattern 162. The formation of the gate spacers GSP may include forming a gate spacer layer covering the mask pattern 164, the sacrificial gate pattern 162, and the etch stop pattern 160 on the substrate 100, and anisotropically etching the gate spacer layer. For example, the mask pattern 164 and the gate spacers GSP may include silicon nitride.

Figure 7:
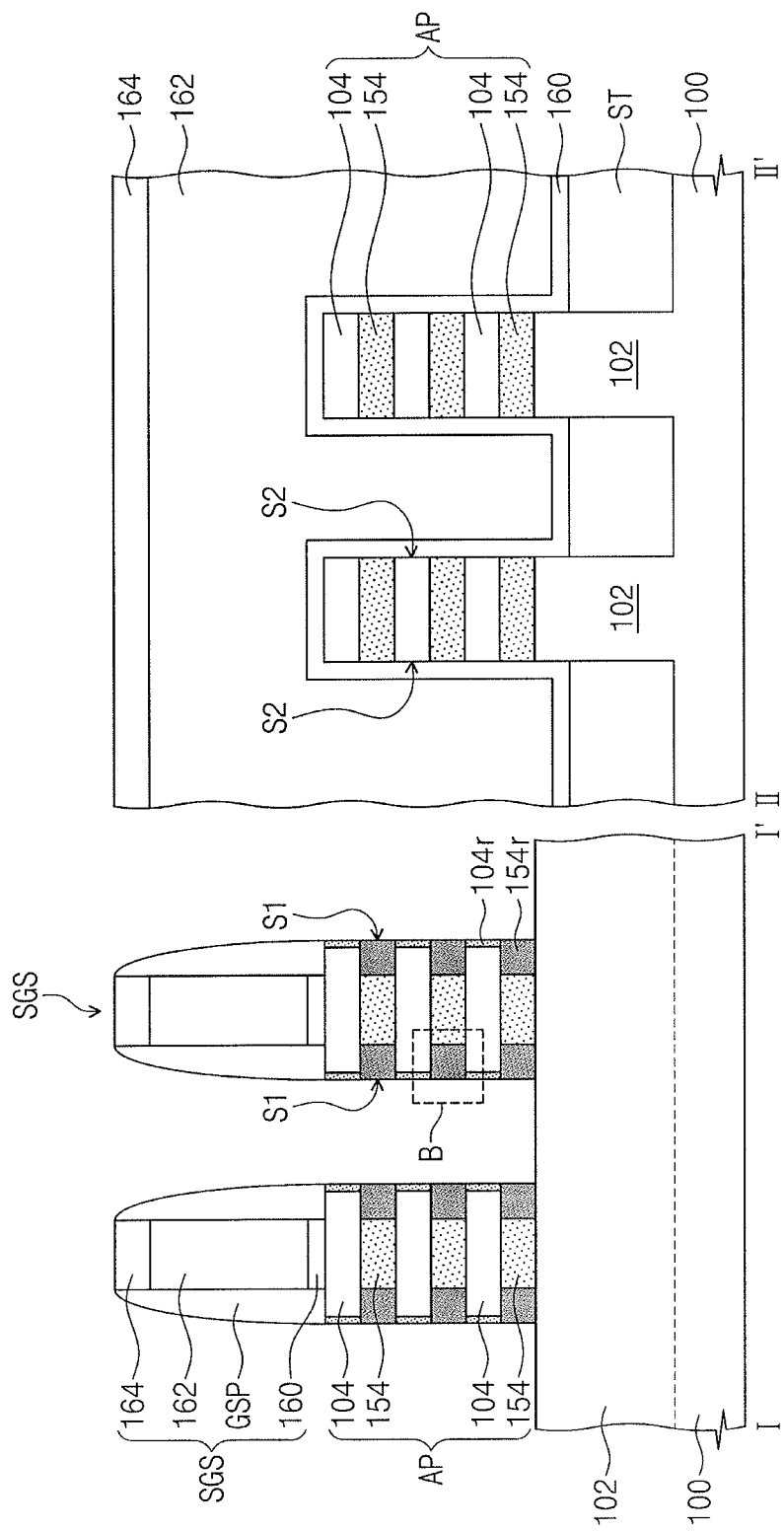

Referring to FIGS. 1 and 7, the preliminary active pattern PAP may be patterned to form an active pattern AP under the sacrificial gate structure SGS. The formation of the active pattern AP may include removing portions of the preliminary active pattern PAP disposed at both sides of the sacrificial gate structure SGS. The removal of the portions of the preliminary active pattern PAP may include etching the portions of the preliminary active pattern PAP using the mask pattern 164 and the gate spacers GSP as an etch mask. The portions of the preliminary active pattern PAP may be etched to expose the top surface of the base active pattern 102 disposed at both sides of the sacrificial gate structure SGS. The active pattern AP may include sacrificial patterns 154 and semiconductor patterns 104, which are alternately and repeatedly stacked on the base active pattern 102. The sacrificial patterns 154 may be formed by patterning the preliminary sacrificial patterns 150P, and the semiconductor patterns 104 may be formed by patterning the preliminary semiconductor patterns 152P.

The active pattern AP may include first sidewalls S1 opposite to each other in the first direction D1 and second sidewalls S2 opposite to each other in the second direction D2. The second sidewalls S2 of the active pattern AP may be covered by the sacrificial gate structure SGS. For example, the sacrificial gate pattern 162 may cover the second sidewalls S2 and a top surface of the active pattern AP and may also cover the top surfaces of the device isolation patterns ST. The etch stop pattern 160 may be disposed between the sacrificial gate pattern 162 and the active pattern AP and may extend between the sacrificial gate pattern 162 and each of the device isolation patterns ST. The first sidewalls S1 of the active pattern AP may not be covered by the sacrificial gate structure SGS but may be exposed.

An oxidation process may be performed on the substrate 100. The first sidewalls S1 of the active pattern AP may be oxidized by the oxidation process. Thus, first spacer patterns 154r may be formed at both sides of each of the sacrificial patterns 154, and at the same time, second spacer patterns 104r may be formed at both sides of each of the semiconductor patterns 104. The first spacer patterns 154r may be spaced apart from each other in the first direction D1 with each of the sacrificial patterns 154 interposed therebetween, and the second spacer patterns 104r may be spaced apart from each other in the first direction D1 with each of the semiconductor patterns 104 interposed therebetween.

The first spacer patterns 154r may be oxidized portions of each of the sacrificial patterns 154. The sacrificial patterns 154 may include the first semiconductor material containing the impurities, and the first spacer patterns 154r may include an oxide containing the impurities. For example, when the sacrificial patterns 154 include silicon-germanium (SiGe) doped with aluminum (Al), the first spacer patterns 154r may include aluminum oxide (e.g., $Al_2O_3$). The second spacer patterns 104r may be oxidized portions of each of the semiconductor patterns 104. The semiconductor patterns 104 may include the second semiconductor material, and the second spacer patterns 104r may include an oxide of the second semiconductor material. For example, the semiconductor patterns 104 may include silicon (Si), and the second spacer patterns 104r may include silicon oxide (e.g., $SiO_2$).

Referring to FIGS. 12A and 12B, each of the first and second spacer patterns 154r and 104r may have a thickness in the first direction D1. A thickness t1 of each of the first spacer patterns 154r may be greater than a thickness t2 of each of the second spacer patterns 104r. When the sacrificial patterns 154 include the first semiconductor material containing the impurities and the semiconductor patterns 104 include the second semiconductor material, an oxidation rate of the sacrificial patterns 154 may be greater than an oxidation rate of the semiconductor patterns 104 during the oxidation process. In this case, an absolute value of a standard enthalpy of formation of the oxide (e.g., $Al_2O_3$) containing the impurities in the first spacer patterns 154r may be greater than that of the oxide (e.g., $SiO_2$) of the second semiconductor material in the second spacer patterns 104r. Thus, during the oxidation process, the first spacer patterns 154r may be formed to be thicker than the second spacer patterns 104r. In an implementation, each of the first spacer patterns 154r may have a substantially quadrilateral shape (e.g., a rectangular or square shape), as illustrated in FIG. 12A. In this case, one surface of each of the first spacer patterns 154r, which is directly adjacent to each of the sacrificial patterns 154, may be substantially flat. In an implementation, a part or side of each of the first spacer patterns 154r may have a substantially semicircular shape, as illustrated in FIG. 12B. In this case, one surface of each of the first spacer patterns 154r, which is directly adjacent to each of the sacrificial patterns 154, may be rounded toward each of the sacrificial patterns 154 (e.g., may protrude convexly toward the sacrificial pattern 154).

Figure 8:
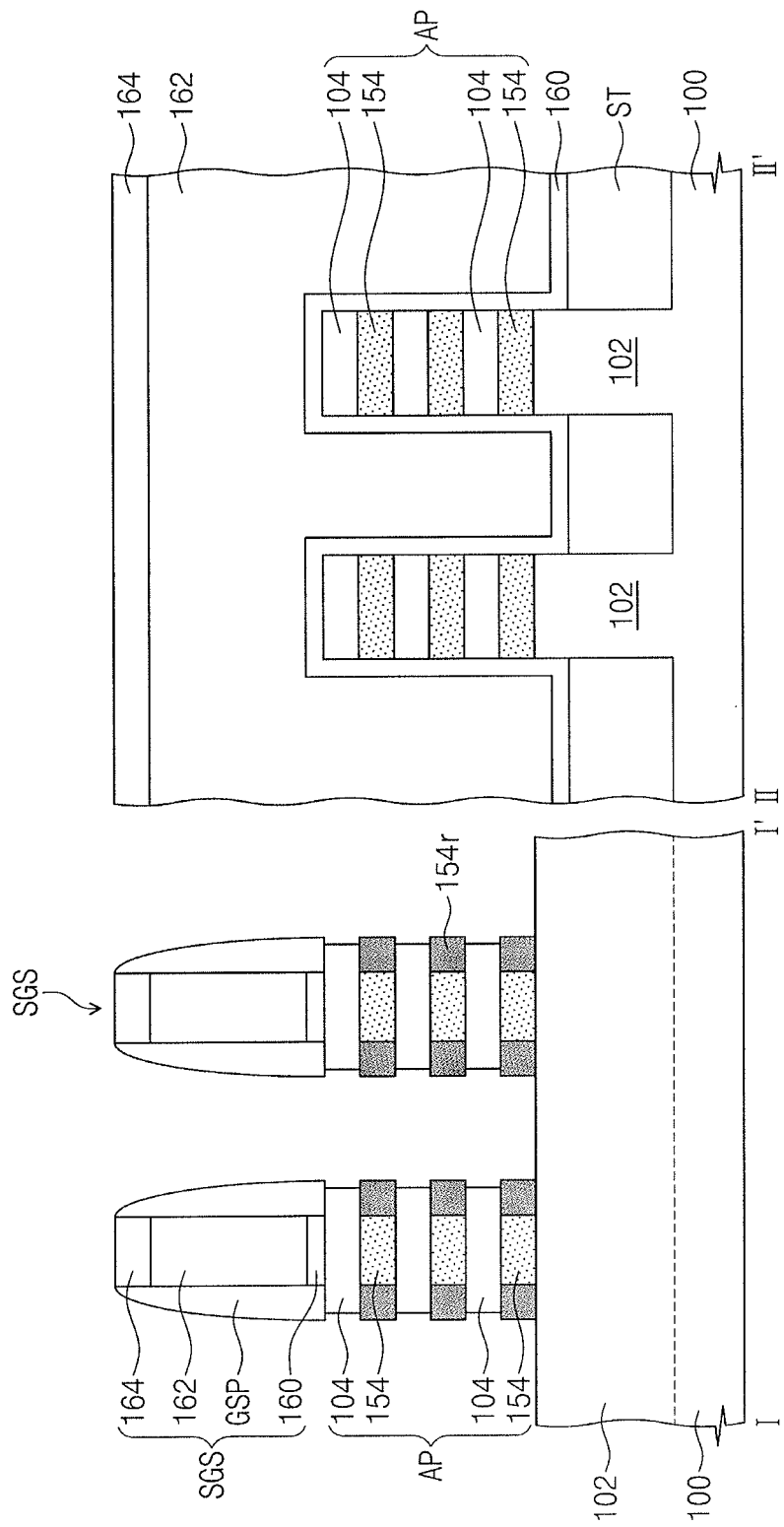

Referring to FIGS. 1 and 8, the second spacer patterns 104r may be selectively removed. The removal of the second spacer patterns 104r may include performing an etching process having an etch selectivity with respect to the semiconductor patterns 104 and the first spacer patterns 154r. In addition, the etching process may also have an etch selectivity with respect to the mask pattern 164, the gate spacers GSP, and the base active pattern 102. For example, during the etching process, an etch rate of the second spacer patterns 104r may be greater than those of the semiconductor patterns 104, the first spacer patterns 154r, the mask pattern 164, the gate spacers GSP, and the base active pattern 102. For example, the etching process may be a wet etching process using hydrofluoric acid (HF) as an etching source. The second spacer patterns 104r may be selectively removed, and sidewalls of the semiconductor patterns 104 may be exposed. The first spacer patterns 154r may not be removed by the etching process, and may remain at both sides of each of the sacrificial patterns 154.

Figure 9:
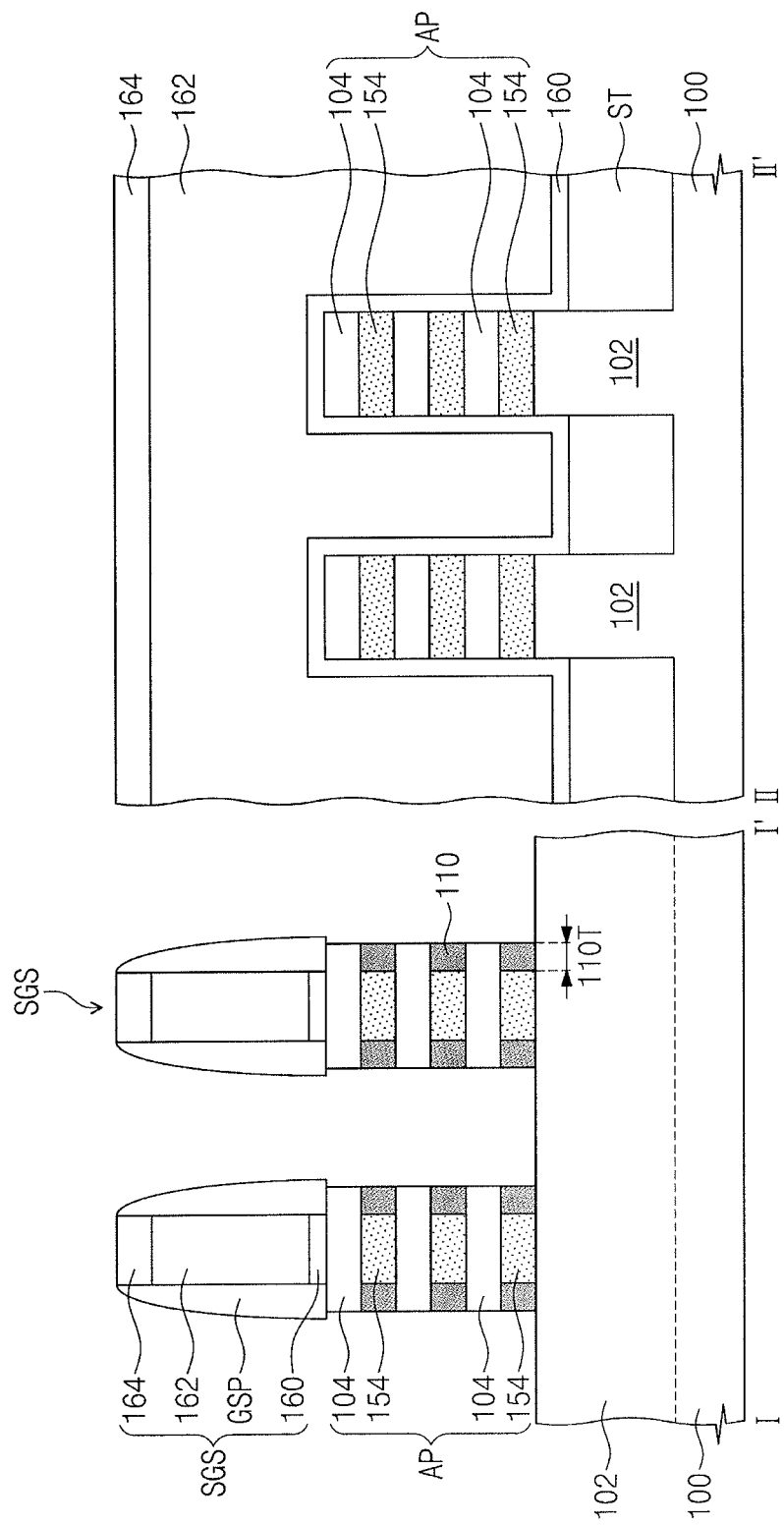

Referring to FIGS. 1 and 9, spacer patterns 110 may be formed by removing portions of the first spacer patterns 154r. The formation of the spacer patterns 110 may include dry-etching the portion of each of the first spacer patterns 154r in such a way that each of the spacer patterns 110 has a desired thickness 110T.

Figure 10:
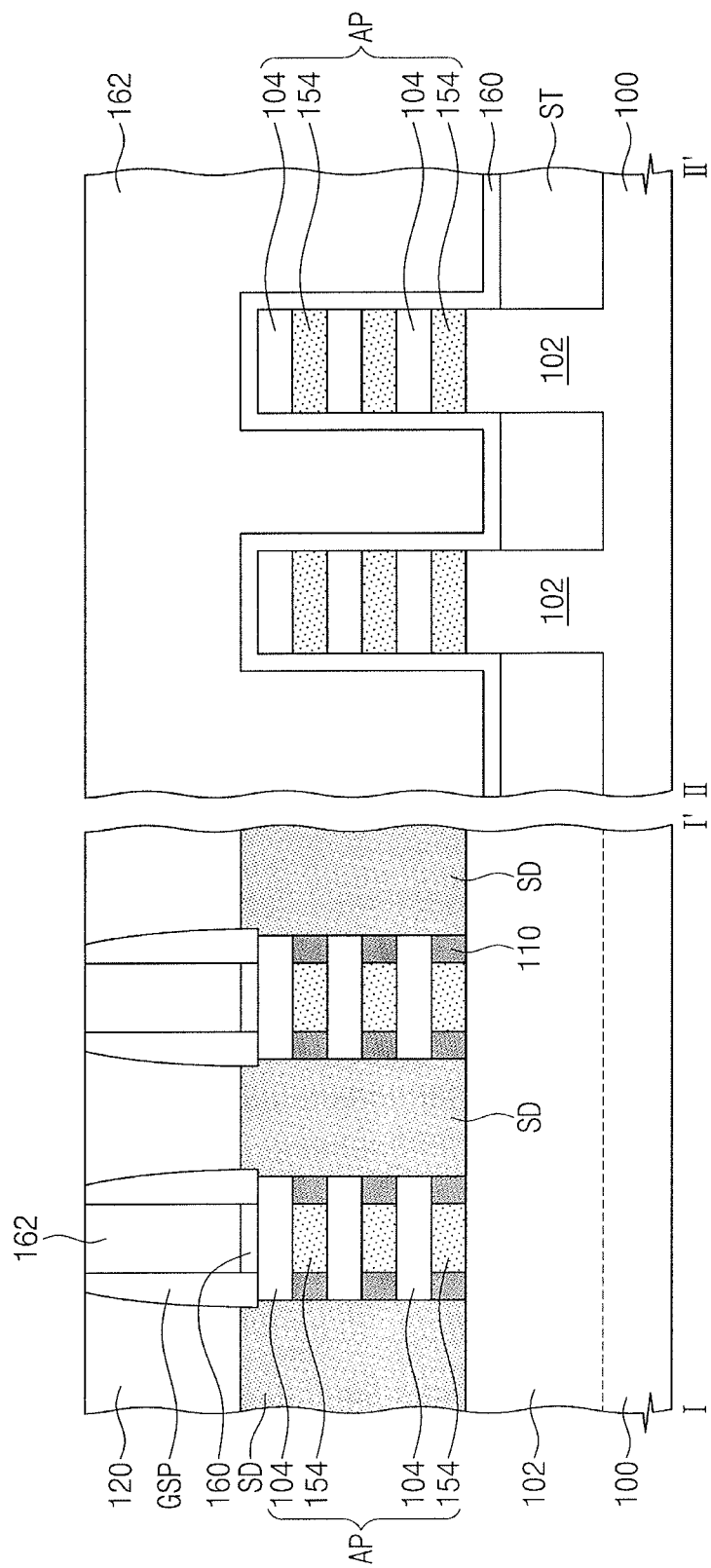

Referring to FIGS. 1 and 10, source/drain patterns SD may be formed on the base active pattern 102 at both sides of the sacrificial gate structure SGS. The source/drain patterns SD may be formed by performing a selective epitaxial growth (SEG) process using the semiconductor patterns 104 and the base active pattern 102 as a seed. Each of the source/drain patterns SD may be in contact with the exposed sidewalls of the semiconductor patterns 104 and the top surface of the base active pattern 102. The source/drain patterns SD may be electrically connected to each other through the semiconductor patterns 104 when channels are generated in the semiconductor patterns 104. The source/drain patterns SD may be spaced apart from the sacrificial patterns 154 with the spacer patterns 110 interposed therebetween. The source/drain patterns SD may be in contact with the spacer patterns 110.

In an implementation, the source/drain patterns SD may include, e.g., silicon-germanium (SiGe), silicon (Si), or silicon carbide (SiC). The formation of the source/drain patterns SD may further include doping the source/drain patterns SD with dopants during or after the SEG process. The dopants may be employed to help improve electrical characteristics of a transistor including the source/drain patterns SD. When the transistor is an NMOSFET, the dopants may include, e.g., phosphorus (P). When the transistor is a PMOSFET, the dopants may include, e.g., boron (B).

An interlayer insulating layer 120 may be formed on the substrate 100 having the source/drain patterns SD thereon. The formation of the interlayer insulating layer 120 may include forming an insulating layer covering the source/drain patterns SD and the sacrificial gate structure SGS on the substrate 100, and planarizing the insulating layer until the sacrificial gate pattern 162 is exposed. The mask pattern 164 may be removed by the planarization process. In an implementation, the interlayer insulating layer 120 may include, e.g., a silicon oxide layer, a silicon nitride layer, a silicon oxynitride layer, or a low-k dielectric layer.

Figure 11:
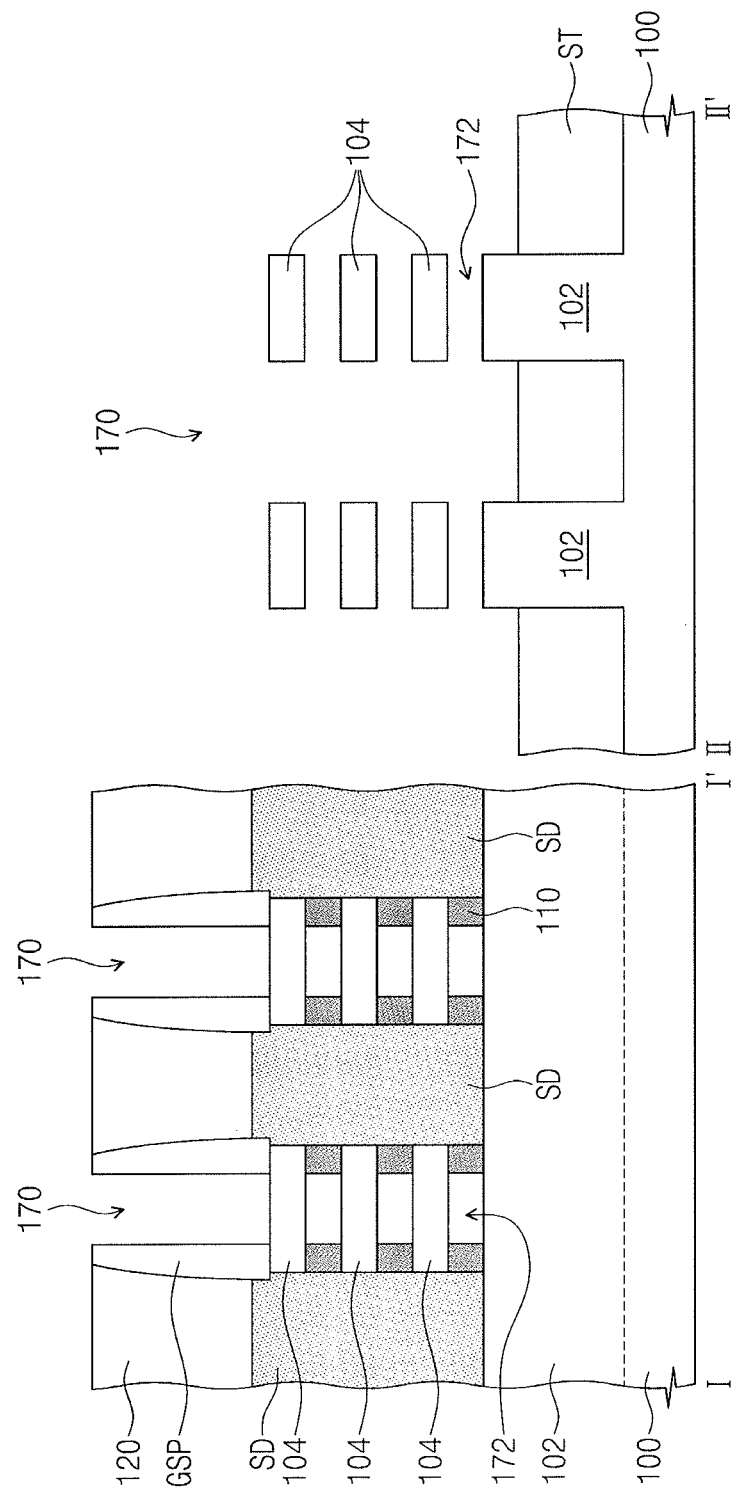
Figure 12A:
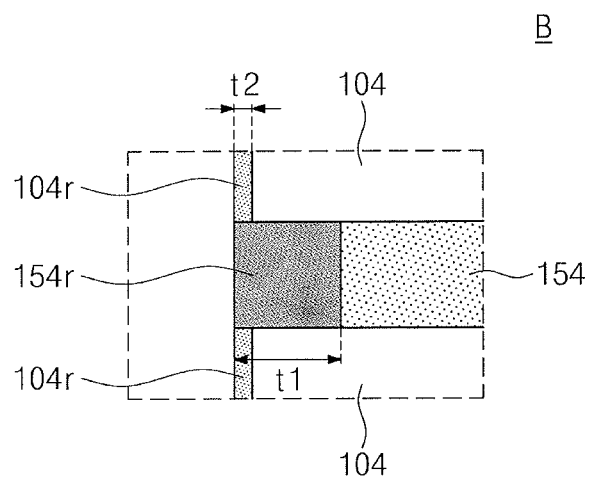
FIGS. 12A and 12B illustrate enlarged views of a portion 'B' of FIG. 7.
Figure 12B:
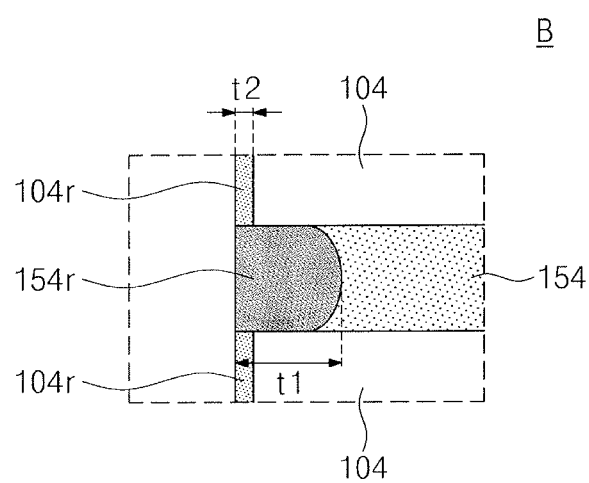

Referring to FIGS. 1 and 11, the sacrificial gate pattern 162 and the etch stop pattern 160 may be removed to form a gap region 170 in the interlayer insulating layer 120. The gap region 170 may be an empty region defined by the gate spacers GSP. The gap region 170 may expose the active pattern AP. The formation of the gap region 170 may include etching the sacrificial gate pattern 162 by performing an etching process having an etch selectivity with respect to the gate spacers GSP, the interlayer insulating layer 120, and the etch stop pattern 160, and removing the etch stop pattern 160 to expose the semiconductor patterns 104 and the sacrificial patterns 154. The gap region 170 may have a linear shape extending in the second direction D2 in a plan view and may also expose the top surfaces of the device isolation patterns ST.

The exposed sacrificial patterns 154 may be selectively removed. For example, when the sacrificial patterns 154 include silicon-germanium (SiGe) doped with the impurities and the semiconductor patterns 104 include silicon (Si), the sacrificial patterns 154 may be selectively removed by performing a wet etching process using peracetic acid as an etching source. During the selective removal process, the source/drain patterns SD may be protected by the interlayer insulating layer 120 and the spacer patterns 110. The sacrificial patterns 154 may be selectively removed, and empty regions 172 may be formed between the semiconductor patterns 104 and between the base active pattern 102 and a lowermost one of the semiconductor patterns 104. The empty regions 172 may be connected to the gap region 170.

Referring again to FIGS. 1 and 2, a gate insulating pattern GI and a gate electrode GE may be formed to fill the gap region 170 and the empty regions 172. The formation of the gate insulating pattern GI and the gate electrode GE may include forming a gate insulating layer conformally covering inner surfaces of the gap region 170 and the empty regions 172, forming a gate conductive layer filling remaining portions of the gap region 170 and the empty regions 172, and locally forming the gate insulating pattern GI and the gate electrode GE in the gap region 170 and the empty regions 172 by performing a planarization process on the gate conductive layer and the gate insulating layer until the interlayer insulating layer 120 is exposed. In an implementation, the gate insulating layer may be formed of, e.g., a silicon oxide layer, a silicon nitride layer, a silicon oxynitride layer, or a high-k dielectric layer, and the gate conductive layer may be formed of, e.g., a doped semiconductor material, a conductive metal nitride, or a metal. The gate electrode GE may be spaced apart from the semiconductor patterns 104 and the base active pattern 102 with the gate insulating pattern GI interposed therebetween and may be spaced apart from the source/drain patterns SD with the spacer patterns 110 interposed therebetween.

Upper portions of the gate insulating pattern GI and the gate electrode GE may be recessed to form a groove region between the gate spacers GSP. A gate capping pattern CAP may be formed in the groove region. The formation of the gate capping pattern CAP may include forming a gate capping layer filling the groove region on the interlayer insulating layer 120, and planarizing the gate capping layer until the interlayer insulating layer 120 is exposed. In an implementation, the gate capping layer may include, e.g., a silicon oxide layer, a silicon nitride layer, or a silicon oxynitride layer.

The gate insulating pattern GI, the gate electrode GE, the gate capping pattern CAP, and the gate spacers GSP may constitute a gate structure GS. The semiconductor patterns 104 may constitute a channel pattern CH. The source/drain patterns SD may be spaced apart from each other in the first direction D1 with the channel pattern CH interposed therebetween, and the source/drain patterns SD may be in contact with the channel pattern CH. The channel pattern CH and the source/drain patterns SD may constitute an active structure AS provided on the base active pattern 102. The active structure AS and the gate electrode GE may constitute a gate-all-around type field effect transistor.

In an implementation, an upper insulating layer may be formed on the interlayer insulating layer 120. First contact plugs may be formed to penetrate the upper insulating layer and the interlayer insulating layer 120 and may be electrically connected to the source/drain patterns SD. A second contact plug may be formed to penetrate the upper insulating layer and the gate capping pattern CAP and may be electrically connected to the gate electrode GE. Interconnection lines may be formed on the upper insulating layer so as to be connected to the first and second contact plugs. The first and second contact plugs and the interconnection lines may be formed of a conductive material.

In an implementation, the spacer patterns 110 may correspond to the first spacer patterns 154r formed by oxidizing portions of each of the sacrificial patterns 154. The sacrificial patterns 154 may include the first semiconductor material containing the impurities, and the first spacer patterns 154r may be formed to be thicker than the second spacer patterns 104r, during the oxidation process. For example, in this case, the spacer patterns 110 having relatively thick thicknesses 110T may be easily formed, and thus it may be easy to prevent an electrical short between the gate electrode GE and the source/drain patterns SD.

In addition, the thickness t1 of the first spacer patterns 154r may be easily adjusted by adjusting the oxidation rate of the sacrificial patterns 154 during the oxidation process. Thus, the spacer patterns 110 having the desired thickness 110T may be reproducibly formed. Furthermore, the first spacer patterns 154r may be used as the spacer patterns 110, and manufacturing processes for forming the spacer patterns 110 may be simplified. Thus, it may be easy to reproducibly form the spacer patterns 110.

Figure 13:
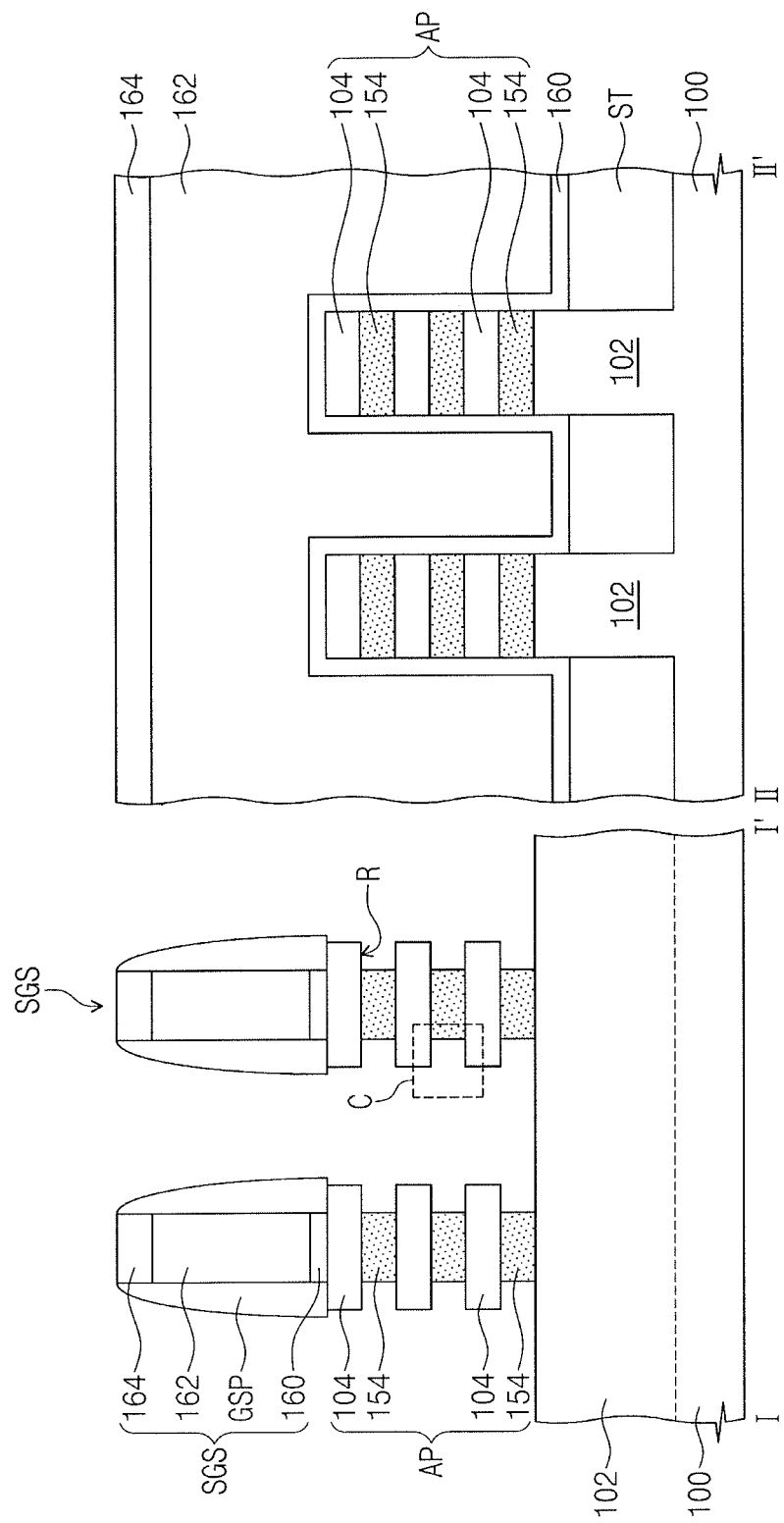
FIGS. 13 and 14 illustrate cross-sectional views corresponding to the lines I-I' and II-II' of FIG. 1 to show stages in a method for manufacturing a semiconductor device according to some embodiments.
Figure 14:
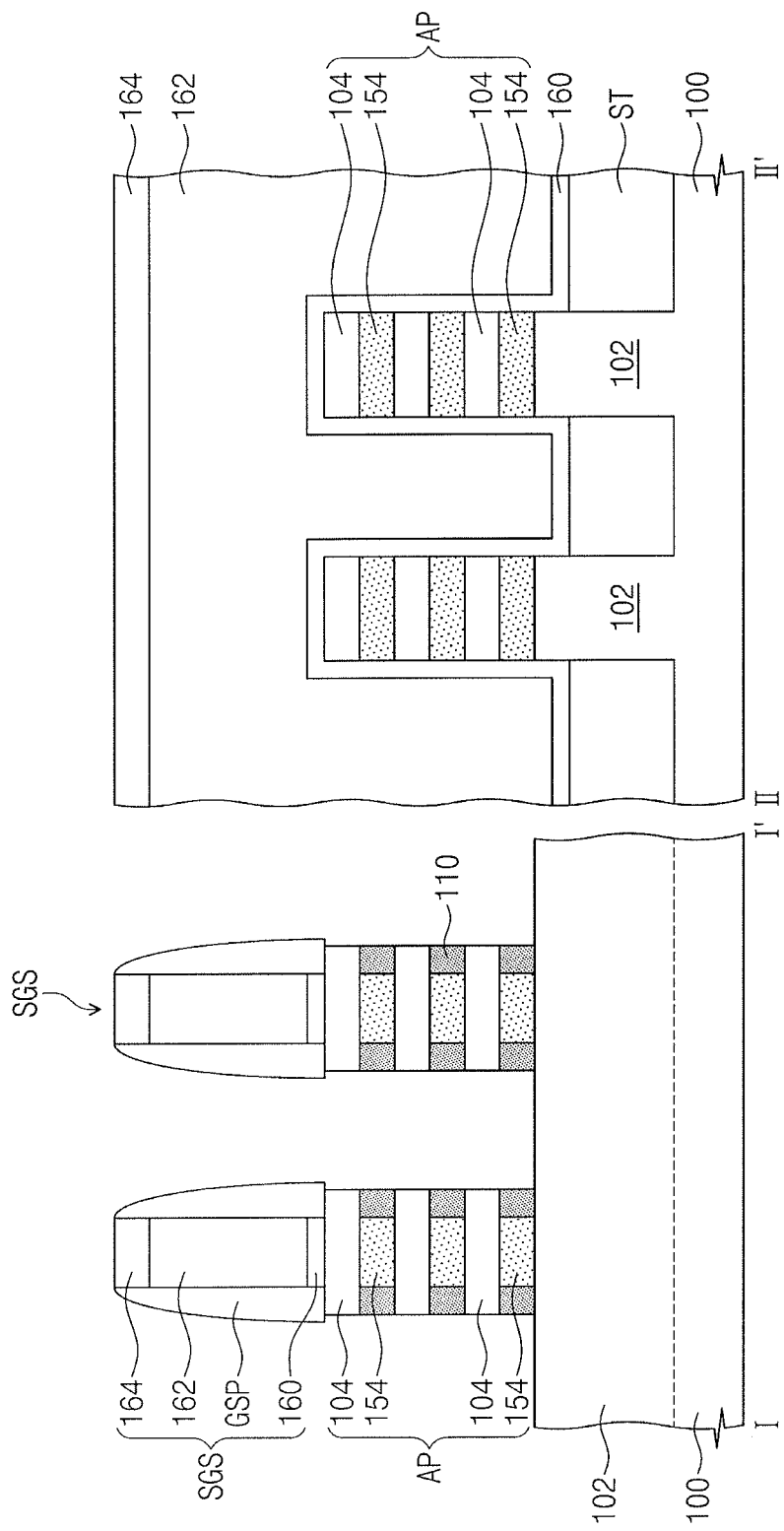
Figure 15A:
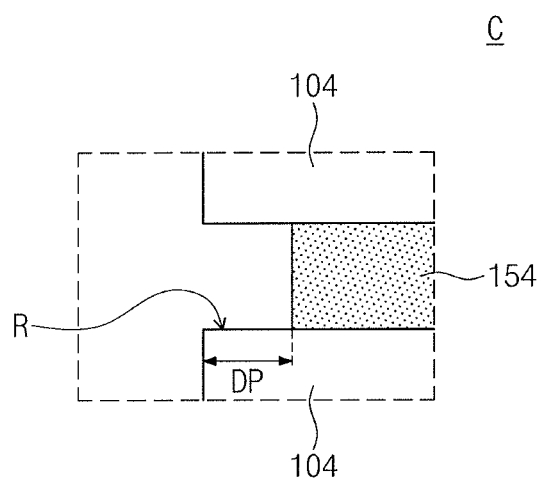
FIGS. 15A and 15B illustrate enlarged views of a portion 'C' of FIG. 13.
Figure 15B:
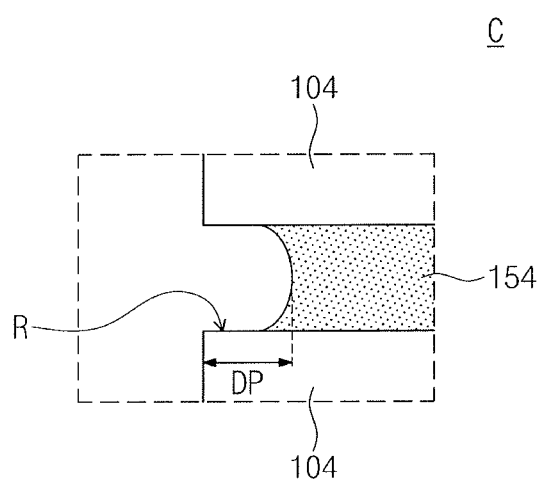

FIGS. 13 and 14 illustrate cross-sectional views corresponding to the lines I-I' and II-II' of FIG. 1 to show stages in a method for manufacturing a semiconductor device according to some embodiments. FIGS. 15A and 15B illustrate enlarged views of a portion 'C' of FIG. 13. Hereinafter, differences between the present embodiment and the embodiments of FIGS. 4 to 11, 12A and 12B will be mainly described for the purpose of ease and convenience in explanation.

As described with reference to FIGS. 1 and 4 to 7, the sacrificial layers 150 and the semiconductor layers 152 may be alternately and repeatedly stacked on the substrate 100. The sacrificial layers 150 may include the first semiconductor material containing the impurities, and the semiconductor layers 152 may include the second semiconductor material different from the first semiconductor material. The semiconductor layers 152, the sacrificial layers 150, and the upper portion of the substrate 100 may be sequentially patterned to form the trenches T defining the preliminary active pattern PAP and the base active pattern 102. The preliminary active pattern PAP may include the preliminary sacrificial patterns 150P and the preliminary semiconductor patterns 152P, which are formed by patterning the sacrificial layers 150 and the semiconductor layers 152, respectively. The base active pattern 102 may be formed by patterning the upper portion of the substrate 100. The device isolation patterns ST may be formed to fill the trenches T, respectively. The sacrificial gate structure SGS may be formed to intersect the preliminary active pattern PAP. Portions of the preliminary active pattern PAP disposed at both sides of the sacrificial gate structure SGS may be removed to form the active pattern AP under the sacrificial gate structure SGS. The active pattern AP may include the sacrificial patterns 154 and the semiconductor patterns 104, which are alternately and repeatedly stacked on the base active pattern 102. The sacrificial patterns 154 may be formed by patterning the preliminary sacrificial patterns 150P, and the semiconductor patterns 104 may be formed by patterning the preliminary semiconductor patterns 152P. The active pattern AP may include the first sidewalls S1 opposite to each other in the first direction D1 and the second sidewalls S2 opposite to each other in the second direction D2. The second sidewalls S2 of the active pattern AP may be covered by the sacrificial gate structure SGS, and the first sidewalls S1 of the active pattern AP may not be covered by the sacrificial gate structure SGS but may be exposed. The oxidation process may be performed on the substrate 100 to oxidize the first sidewalls Si of the active pattern AP. Thus, the first spacer patterns 154r may be formed at both sides of each of the sacrificial patterns 154, and at the same time, the second spacer patterns 104r may be formed at both sides of each of the semiconductor patterns 104. The first spacer patterns 154r may be the oxidized portions of each of the sacrificial patterns 154 and may include the oxide containing the impurities. The second spacer patterns 104r may be the oxidized portions of each of the semiconductor patterns 104 and may include the oxide of the second semiconductor material.

Referring to FIGS. 1 and 13, the first spacer patterns 154r and the second spacer patterns 104r may be removed. In an implementation, the first spacer patterns 154r may be removed after the second spacer patterns 104r are selectively removed as described with reference to FIGS. 1 and 8. The first spacer patterns 154r may be removed by performing an etching process having an etch selectivity with respect to the semiconductor patterns 104 and the sacrificial patterns 154. In addition, the etching process may also have an etch selectivity with respect to the mask pattern 164, the gate spacers GSP, and the base active pattern 102. For example, during the etching process, an etch rate of the first spacer patterns 154r may be greater than those of the semiconductor patterns 104, the sacrificial patterns 154, the mask pattern 164, the gate spacers GSP, and the base active pattern 102. For example, the etching process may be a wet etching process using sulfuric acid (H$_2$SO$_4$) as an etching source. The first spacer patterns 154r may be removed, and recess regions R may be formed to expose both sidewalls of each of the sacrificial patterns 154, respectively. Each of the recess regions R may be formed between vertically adjacent semiconductor patterns 104 or between the base active pattern 102 and the lowermost one of the semiconductor patterns 104. Each of the recess regions R may expose one sidewall of each of the sacrificial patterns 154.

In an implementation, the second spacer patterns 104r may be removed after the first spacer patterns 154r are selectively removed. In this case, the first spacer patterns 154r may be selectively removed as described above, and the second spacer patterns 104r may be selectively removed as described with reference to FIGS. 1 and 8.

In an implementation, the first spacer patterns 154r and the second spacer patterns 104r may be removed at the same time. In this case, the first and second spacer patterns 154r and 104r may be removed by performing an etching process having an etch selectivity with respect to the semiconductor patterns 104, the sacrificial patterns 154, the mask pattern 164, the gate spacers GSP, and the base active pattern 102. For example, the etching process may be a dry etching process using hydrogen chloride (HCl) as an etching gas.

Referring to FIGS. 15A and 15B, an inner surface of each of the recess regions R may have a shape corresponding to an outer surface of each of the first spacer patterns 154r. In an implementation, each of the first spacer patterns 154r may have a substantially quadrilateral shape (e.g., a rectangular or square shape), as described with reference to FIG. 12A. In this case, the inner surface of each of the recess regions R may have a shape corresponding to the quadrilateral shape, as illustrated in FIG. 15A. For example, the one sidewall of each of the sacrificial patterns 154, which is exposed by each of the recess regions R, may be substantially flat. In an implementation, a portion of each of the first spacer patterns 154r may have a substantially semicircular shape, as described with reference to FIG. 12B. In this case, the inner surface of each of the recess regions R may have a shape corresponding to the semicircular shape, as illustrated in FIG. 15B. For example, the one sidewall of each of the sacrificial patterns 154, which is exposed by each of the recess regions R, may be rounded toward the inside of each of the sacrificial patterns 154. Each of the recess regions R may be formed to have a depth DP corresponding to the thickness t1 of each of the first spacer patterns 154r.

Referring to FIGS. 1 and 14, spacer patterns 110 may be formed in the recess regions R, respectively. The formation of the spacer patterns 110 may include conformally forming a spacer layer filling the recess regions R on the substrate 100, and anisotropically etching the spacer layer to locally form the spacer patterns 110 in the recess regions R, respectively. In an implementation, the spacer patterns 110 may include a low-k dielectric material (e.g., silicon nitride). In an implementation, the spacer patterns 110 may include, e.g., SiN, SiCN, SiOCN, SiBCN, or SiBN.

Subsequent processes may be substantially the same as described with reference to FIGS. 1, 2, 10, and 11.

According to the present embodiment, the recess regions R may be formed by removing the first spacer patterns 154r, which are formed by oxidizing portions of each of the sacrificial patterns 154. The sacrificial patterns 154 may include the first semiconductor material containing the impurities, and the first spacer patterns 154r may be formed to have the relatively thick thickness t1 by the oxidation process. Thus, each of the recess regions R may be formed to have the depth DP corresponding to the thickness t1 of each of the first spacer patterns 154r. The spacer patterns 110 may be formed using an additional spacer layer deposited in the recess regions R. In this case, it is possible to easily form the spacer patterns 110 having a relatively thick thickness 110T and including a material having a relatively low dielectric constant. Thus, electrical characteristics of the transistor including the gate electrode GE and the active structure AS may be improved.

In addition, the thickness t1 of the first spacer patterns 154r may be easily adjusted by adjusting the oxidation rate of the sacrificial patterns 154 during the oxidation process. Thus, the spacer patterns 110 having the desired thickness 110T may be reproducibly formed.

According to an embodiment, portions of each of the sacrificial patterns 154 may be oxidized to form the first spacer patterns 154r. The sacrificial patterns 154 may include the first semiconductor material containing the impurities, and it may be easy to reproducibly form the first spacer patterns 154r having the relatively thick thicknesses. In addition, when the first spacer patterns 154r are used as the spacer patterns 110, manufacturing processes for forming the spacer patterns 110 may be simplified. As a result, it is possible to provide or realize the semiconductor device and the method for manufacturing the same, which can improve electrical characteristics and can reproducibly form the spacer patterns 110.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, operating characteristics of semiconductor devices may be deteriorated by reduction in size of MOSFETs. Semiconductor devices capable of overcoming limitations according to a high integration density of semiconductor devices and of improving performance of semiconductor devices may be considered.

The embodiments may provide a semiconductor device with improved electrical characteristics.

The embodiments may provide a method for manufacturing a semiconductor device, which is capable of easily realizing reproducible formation of a pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor device, the method comprising:
   forming an active pattern on a substrate such that the active pattern includes sacrificial patterns and semiconductor patterns alternately and repeatedly stacked on the substrate;
   forming first spacer patterns at both sides of each of the sacrificial patterns by performing an oxidation process; and
   forming second spacer patterns at both sides of each of the semiconductor patterns by performing the oxidation process,
   wherein the first spacer patterns correspond to oxidized portions of each of the sacrificial patterns, and the second spacer patterns correspond to oxidized portions of each of the semiconductor patterns,
   wherein the sacrificial patterns include a first semiconductor material containing impurities,
   wherein the semiconductor patterns include a second semiconductor material different from the first semiconductor material,
   wherein the impurities include an element different from semiconductor elements of the first semiconductor material and the second semiconductor material, and
   wherein the first spacer patterns include the impurities.

2. The method as claimed in claim 1, wherein the first spacer patterns include an oxide containing the impurities.

3. The method as claimed in claim 1, wherein:
   each of the first spacer patterns has a thickness in a direction parallel to a top surface of the substrate, and
   each of the second spacer patterns has a thickness in the direction parallel to the top surface of the substrate, and
   the thicknesses of the first spacer patterns are greater than the thicknesses of the second spacer patterns.

4. The method as claimed in claim 3, further comprising:
   selectively removing the second spacer patterns;
   removing the sacrificial patterns to form empty regions such that each empty region is defined between first spacer patterns laterally spaced apart from each other; and
   forming a gate electrode in the empty regions.

5. The method as claimed in claim 3, further comprising:
   removing the first and second spacer patterns to form recess regions that respectively expose both sidewalls of each of the sacrificial patterns; and
   forming spacer patterns in the recess regions, respectively,
   wherein each of the recess regions exposes one sidewall of each of the sacrificial patterns and a top or bottom surface of each of adjacent ones of the semiconductor patterns.

6. The method as claimed in claim 5, wherein forming the spacer patterns includes:
   forming a spacer layer filling the recess regions on the substrate; and
   anisotropically etching the spacer layer to locally form the spacer patterns in the recess regions, respectively.

7. The method as claimed in claim 6, further comprising:
   removing the sacrificial patterns to form empty regions such that each empty region is defined between the spacer patterns laterally spaced apart from each other; and
   forming a gate electrode in the empty regions.

8. The method as claimed in claim 1, wherein:
   the active pattern includes first sidewalls opposite to each other in a first direction and second sidewalls opposite to each other in a second direction intersecting the first direction,
   the method further comprises:
   forming a sacrificial gate pattern on the substrate and covering the second sidewalls and a top surface of the active pattern; and
   forming source/drain patterns on the first sidewalls of the active pattern at both sides of the sacrificial gate pattern, respectively, and
   the oxidation process is performed after the forming of the sacrificial gate pattern and before the forming of the source/drain patterns.

9. The method as claimed in claim 1, wherein the impurities include aluminum (Al), gallium (Ga), antimony (Sb), arsenic (As), indium (In), zirconium (Zr), hafnium (Hf), or tantalum (Ta).

10. A method for manufacturing a semiconductor device, the method comprising:
    forming a preliminary active pattern extending in a first direction on a substrate such that the preliminary active pattern includes preliminary sacrificial patterns and preliminary semiconductor patterns alternately and repeatedly stacked on the substrate;
    forming a sacrificial gate pattern on the substrate such that the sacrificial gate pattern extends in a second direction intersecting the first direction to intersect the preliminary active pattern;
    removing portions of the preliminary active pattern at both sides of the sacrificial gate pattern to form an active pattern under the sacrificial gate pattern such that the active pattern includes sacrificial patterns and semiconductor patterns alternately and repeatedly stacked; and
    oxidizing both sidewalls of the active pattern to form first spacer patterns at both sides of each of the sacrificial patterns and second spacer patterns at both sides of each of the semiconductor patterns at the same time,
    wherein the first spacer patterns correspond to oxidized portions of each of the sacrificial patterns and the second spacer patterns correspond to oxidized portions of each of the semiconductor patterns,
    wherein the preliminary sacrificial patterns and the sacrificial patterns include a first semiconductor material containing impurities,
    wherein the preliminary semiconductor patterns and the semiconductor patterns include a second semiconductor material different from the first semiconductor material, and
    wherein the impurities include an element different from semiconductor elements of the first and second semiconductor materials.

11. The method as claimed in claim 10, wherein:
    the active pattern includes first sidewalls opposite to each other in the first direction and second sidewalls opposite to each other in the second direction, the sacrificial gate pattern covers the second sidewalls and a top surface of the active pattern, and the first spacer patterns and the second spacer patterns are formed by oxidizing the first sidewalls.

12. The method as claimed in claim 10, wherein:

the first spacer patterns include the impurities.

13. The method as claimed in claim 12, wherein:

each of the first spacer patterns has a thickness in the first direction, each of the second spacer patterns has a thickness in the first direction, and the thicknesses of the first spacer patterns are greater than the thicknesses of the second spacer patterns.

14. The method as claimed in claim 10, wherein:

the first semiconductor material includes silicon (Si), silicon-germanium (SiGe), or germanium (Ge), the second semiconductor material includes silicon (Si), silicon-germanium (SiGe), or germanium (Ge), and the impurities include aluminum (Al), gallium (Ga), antimony (Sb), arsenic (As), indium (In), zirconium (Zr), hafnium (Hf), or tantalum (Ta).

15. The method as claimed in claim 10, further comprising:

selectively removing the second spacer patterns; and forming source/drain patterns at both sides of the sacrificial gate pattern after the selective removal of the second spacer patterns.

16. The method as claimed in claim 15, further comprising:

removing each sacrificial pattern between the first spacer patterns and the sacrificial gate pattern to form an empty region; and forming a gate electrode in the empty region.

17. The method as claimed in claim 10, further comprising:

removing the first and second spacer patterns;

forming spacer patterns at both sides of each of the sacrificial patterns; and forming source/drain patterns at both sides of the sacrificial gate pattern after the forming of the spacer patterns.

18. The method as claimed in claim 17, wherein the spacer patterns include silicon nitride.

19. The method as claimed in claim 17, further comprising:

removing each sacrificial pattern between the spacer patterns and the sacrificial gate pattern to form an empty region; and forming a gate electrode in the empty region.

* * * * *